United States Patent
Brench

[11] Patent Number: 6,011,299
[45] Date of Patent: *Jan. 4, 2000

[54] APPARATUS TO MINIMIZE INTEGRATED CIRCUIT HEATSINK E.M.I. RADIATION

[75] Inventor: Colin E. Brench, Stow, Mass.

[73] Assignee: Digital Equipment Corporation, Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/686,633

[22] Filed: Jul. 24, 1996

[51] Int. Cl.[7] .......................... H01L 23/552; H01L 23/10; H01L 23/34
[52] U.S. Cl. .......................... 257/660; 257/706; 257/713; 257/722; 361/818; 174/35 R
[58] Field of Search .......................... 257/712, 713, 257/722, 659, 660; 361/818; 174/35 GC, 35 R

[56] References Cited

U.S. PATENT DOCUMENTS 5,297,007  3/1994  Deyo et al. .............................. 361/707
5,818,101  10/1998  Schuster .................................. 257/659

FOREIGN PATENT DOCUMENTS 6-163810  6/1994  Japan ...................................... 257/660

OTHER PUBLICATIONS

"Heat Sink Assembly for Tab–Mounted Devices," pp.372–373, IBM TDB Vo. 31, No. 6, Nov. 1988.

*Primary Examiner*—Teresa M. Arroyo
*Attorney, Agent, or Firm*—Hamilton, Brook, Smith & Reynolds, P.C.

[57] ABSTRACT

A set of conductive plates are positioned adjacent to and in close proximity with a unidirectional heatsink on a high frequency integrated circuit. The set of plates is generally electrically attached to the same ground potential voltage supply as the integrated circuit and serves to damped unwanted radio frequency electromagnetic radiation normally emitted by heatsinks. The same arrangement of plates can also serve as an external electromagnetic interference shield apparatus for the integrated circuit. The plates may alternatively be comprised of a conductive mesh to allow air flow through the plates.

15 Claims, 4 Drawing Sheets

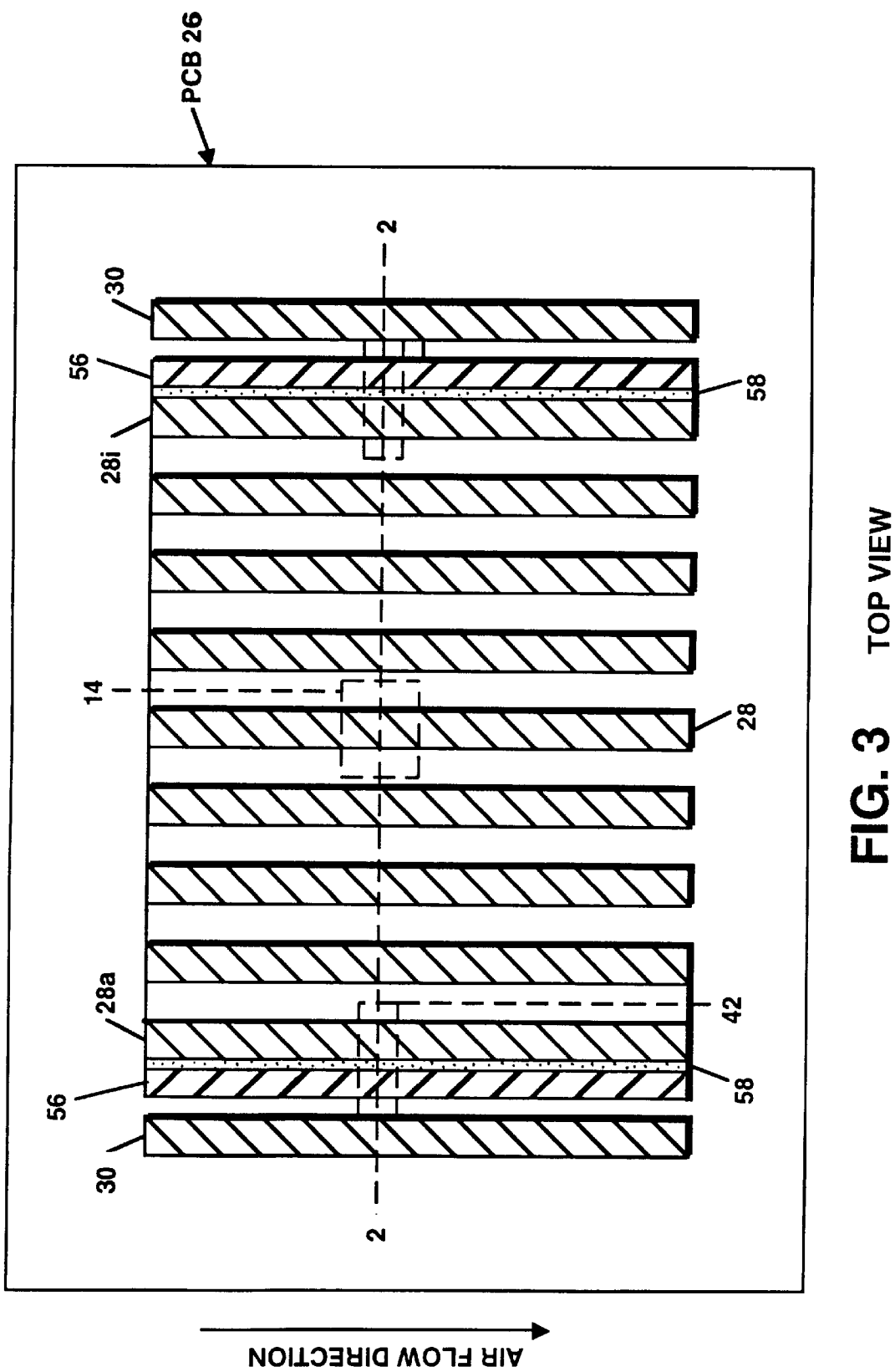
FIG. 3   TOP VIEW

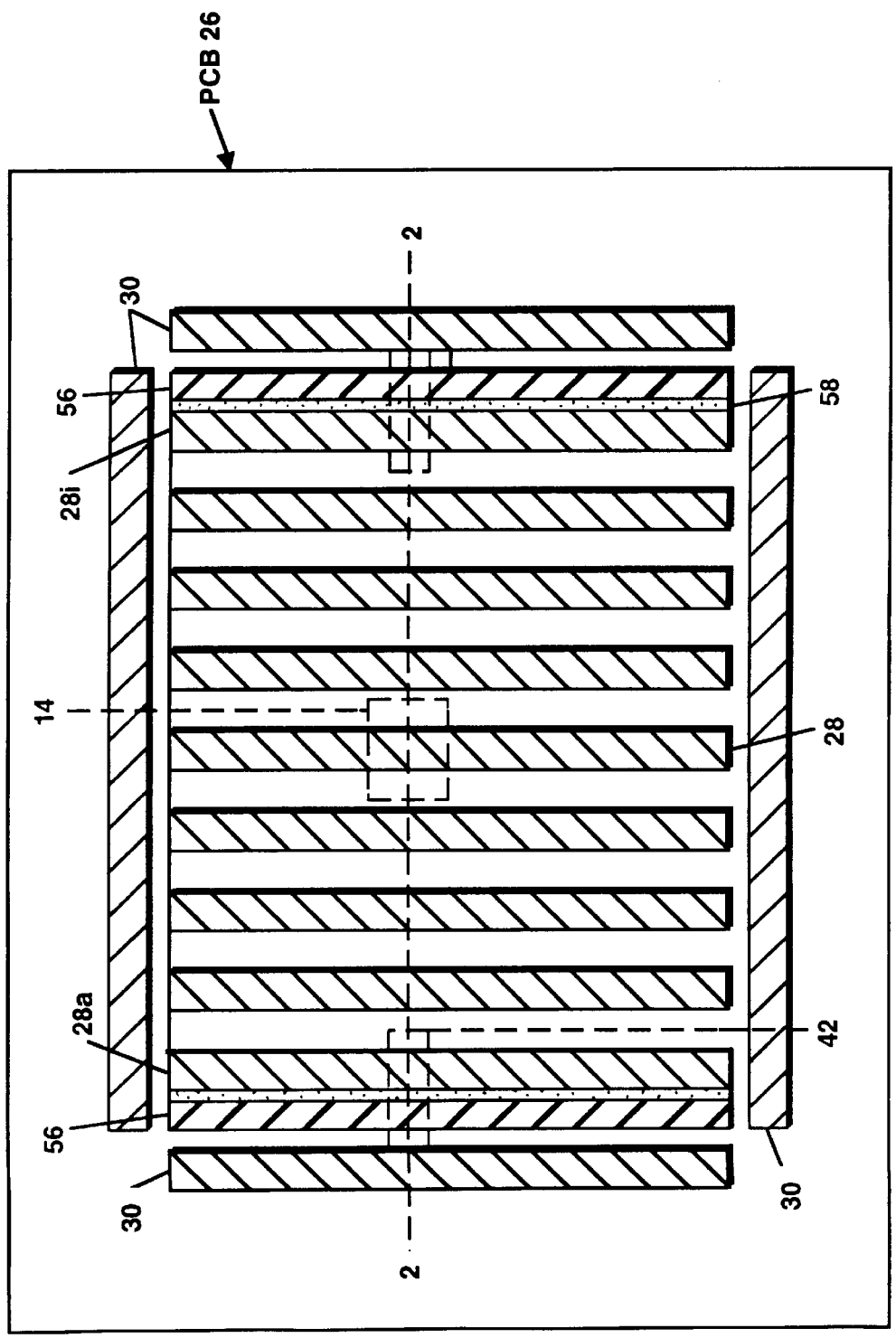
FIG. 4 TOP VIEW

APPARATUS TO MINIMIZE INTEGRATED CIRCUIT HEATSINK E.M.I. RADIATION

BACKGROUND OF THE INVENTION

This invention relates generally to minimizing the amount of Electro Magnetic Interference (EMI) radiation produced by electronic devices, and more specifically, to low cost active and passive planar EMI shields for high frequency electronic devices having attached heatsink members.

Generally, electronic devices emit electromagnetic radiation as an unwanted byproduct of their operation. Electronic devices are also sensitive to external electromagnetic radiation which may corrupt internal signals. Thus, electronic device operation may be interfered with by the action of outside electromagnetic radiation. This is known as Electro Magnetic Interference, or EMI. It is necessary to protect electronic devices from external sources of electromagnetic energy/EMI, and also to prevent internal electromagnetic energy from escaping and possibly interfering with other surrounding electronic devices. One technique used to protect electronic devices from EMI is to surround a system containing the electronic device or devices with a grounded Faraday cage known as a shield. While this approach is effective to reduce EMI levels for an electronic system, it is not effective for individual components within a system. The Faraday cage or shield is often made as a part of the physical enclosure or cabinet of the electronic system. Also, such Faraday cage shielding may be expensive.

Electronic devices are also known to produce heat as an unwanted byproduct of their operation. An increase in temperature of an electronic device may result in a decrease in device reliability and functional lifetime. Thus it is often found necessary to cool electronic devices. One method known in the art for cooling electronic devices is to have a device known as a heatsink attached to the electronic device. The heatsink conducts heat from the electronic device to a source of cooler fluid, such as outside air to reduce the temperature of the electronic device. Typically, the surface area of the heatsink is larger than the surface area of the electronic device itself in order to improve the efficiency of the heat transfer to the cooling fluid. A problem exists in the art because the increased area of the heatsink may also act to increase the amount of EMI emitted by, or absorbed by the electronic device because the heatsink may act as an antenna.

Thus while it is desirable to maximize the total surface area of the heatsink, since this improves cooling efficiency and increases device reliability and potential lifetime, such a maximization of heatsink efficiency may also increase the unwanted emission of EMI radiation from the electronic device.

One type of heatsink that is thermally very efficient is known as a unidirectional heatsink. A unidirectional heatsink typically has fins oriented in a vertical direction so that the air flow is confined to one direction. Unidirectional heatsinks are typically more efficient than omnidirectional heatsinks because the path length that the heat must travel from the IC to the cooled surface is shorter. Unfortunately, the addition of any heatsink generally increases the efficiency of the unwanted radiation.

The heatsink does not need to have a direct physical contact to the electronic device for the heatsink to act as an unwanted antenna. Electronic devices such as integrated circuits (ICs) operate at such high frequencies that even an electrically isolated metal heatsink may become 'capacitively coupled' to the IC, and thus still act as an antenna. This would occur if the spacing between the IC and the antenna is small enough.

A high performance IC is typically packaged in a hermetic ceramic package with a thin electrically insulating ceramic wall between the backside of the IC and the heatsink. For a state of the art high speed and high powered IC the thin ceramic wall produces too much thermal resistance for the amount of heat the IC generates. Such a high powered IC would typically be packaged in a ceramic package that has the metal heatsink penetrating completely through the ceramic package to reduce the resistance to heat flow, and thus a direct electrical connection from the heatsink to the backside of the IC exists.

It is known in the art that the emission of radiation from heatsinks may be reduced by electrically grounding the heat sink. This approach has problems however, such as the possibility of the ground connection producing what is known as a reverse biased junction on the IC. Reverse biased junctions can cause an IC, in particular what are known as CMOS circuits, to go into a destructive state such as latch-up, which can cause the IC to completely destroy itself.

SUMMARY OF THE INVENTION

In accordance with the present invention, an apparatus is provided which suppresses unwanted radio frequency radiation emitted by the heatsinks of integrated circuits. The apparatus includes one or more planar conductive plates which are disposed adjacent to and in close proximity with a heatsink portion of an integrated circuit. Each one of the plates has at least one electrical contact. With such an arrangement, the electrical contact on the plate can be electrically connected to a voltage reference in order to suppress radio frequency radiation emitted by the integrated circuit. Further, this arrangement does not substantially interfere with the cooling function of the heat sink while providing reductions in EMI emissions. The plate also can shield the electronic component from external EMI emitted from neighboring components. The conductive plates can be solid conductors, mesh or printed wiring boards.

BRIEF DESCRIPTION OF THE DRAWINGS

The above and further advantages of the invention may be better understood by referring to the following description in conjunction with the accompanying drawings, in which:

FIG. 3 is a top view of the arrangement of FIG. 2.

FIG. 4 is a top view of an alternative embodiment in accordance with the invention.

DESCRIPTION OF THE PREFERRED EMBODIMENTS

Figure 1:
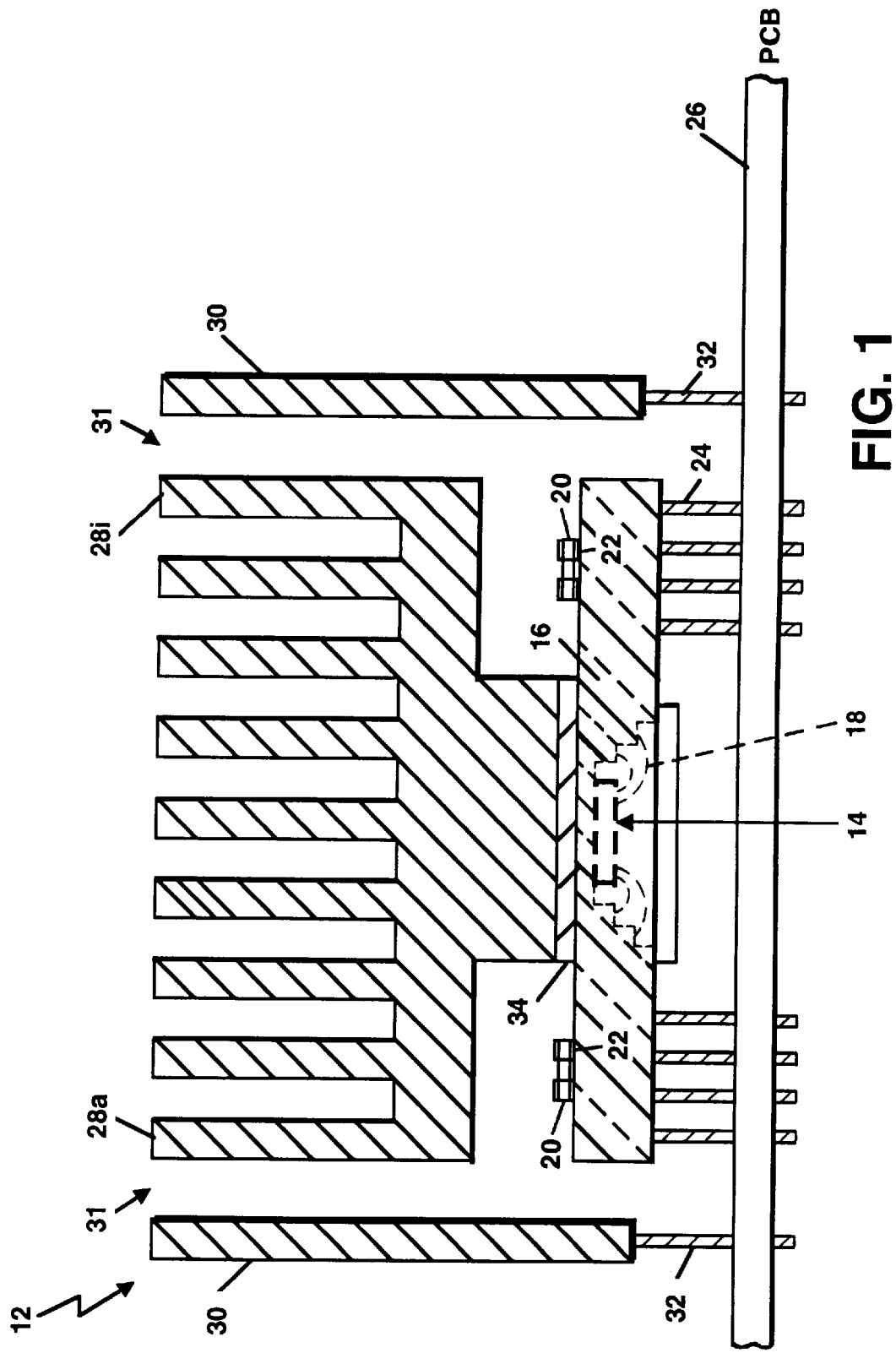
FIG. 1 is a cross sectional view of an IC package with a unidirectional heatsink having a pair of planar conductive plates electrically connected to a PCB to provide an EMI shield.

Referring now to FIG. 1, a packaged integrated circuit arrangement 12 includes an IC circuit 14 connected to a circuit package 16 by wirebonds 18. The IC circuit 14 could also be attached to the package 16 by any of a variety of methods known in the art, such as TAB bonding or Flip-chip bonding. The package 16 may also have capacitors 20 attached to pads 22. The package 16 is here attached via package pins 24 to a Printed Circuit Board (PCB) 26. Pads 22 are electrically attached to either the IC 14 or the package pins 24 by internal conductors (not shown) inside package 16.

The IC 14 in package 16 is electrically isolated from a heat sink 28 by the thin wall of package material to which the backside of IC 14 is attached. The heat sink 28 is typically attached to the package 16 by a conductive epoxy 34, or by a solder or brazing process. The heat sink 28 shown in this representative embodiment is a unidirectional heat sink having a number of parallel vertical fins 28a–28i. Typically, the IC 14 is attached to the package by either a conductive epoxy or by a metallic solder process, since there is a need to maximize the thermal contact between the IC and the metallic heatsink, and the available good thermal conductors tend also to be good electrical conductors. The thickness of the insulating portion of the package 16 to which the IC 14 is attached is typically made as thin as possible to improve the thermal conductivity of the IC to heatsink path. Thus, although the IC 14 is physically isolated from the heat sink 28, it typically is capacitively coupled through the thin package insulating layer. Thus variations in voltage produced by the IC 14 may cause radiation of electromagnetic energy from the heatsink 28.

The arrangement 12 has the IC 14 capacitively coupled to the heatsink 28 through the thin wall of the package 16 to which the IC 14 is attached. Radiation produced by heat sink 28 due to the capacitive coupling to the IC 14 is here partially absorbed by two planar shields 30. The planar shields 30 are attached to the PC board 26 by electrical pins 32, which are similar to the pins 24 that attach the package 16 to the PC board. The shields 30 and the IC package 16 may be attached to the PCB 26 by many other means known in the art, such as surface mount 'gull wing' leads, 'J bend' leads or 'butt joint' leads, for example. The shields 30 are shown as being the same height as the IC package 16. In the general case the shields 30 maybe tall or shorter than the IC package 16, and each individual shield 30 may be of a different height than it neighbors. It is possible to 'tune' the frequency of maximum attenuation of the shield system to the typical output: frequency of the IC 14 by varying the individual shield heights.

The shields 30 can be connected to the same PC board ground plane (i.e., a zero voltage reference) as the IC 14, or to a separate ground plane, or to a totally different static voltage or a dynamic voltage source. Further, the shield 30 may be constructed of any electrically conductive material, such as a metallic plate, a PC board with one or more conductive layers, or a conductive mesh material. The voltage level applied to the shield 30 has no direct effect on the IC 14 because the shield 30 is placed such that there exists an air gap 31 between shield 30 and the heat sink 28. The only direct connection in this preferred embodiment between the shield 30 and the IC 14 will exist because preferably both are electrically attached to the same voltage reference plane through the pins 24 and 32. The air gap 31 between shield 30 and the heat sink 28 is preferably as small as possible, typically less than 0.10 inches, since the magnitude of the 'image charge' provided in shield 30 will be as close as possible to the magnitude of the charge on the heat sink 28 under these conditions, and the radiation reduction will be improved.

Figure 2:
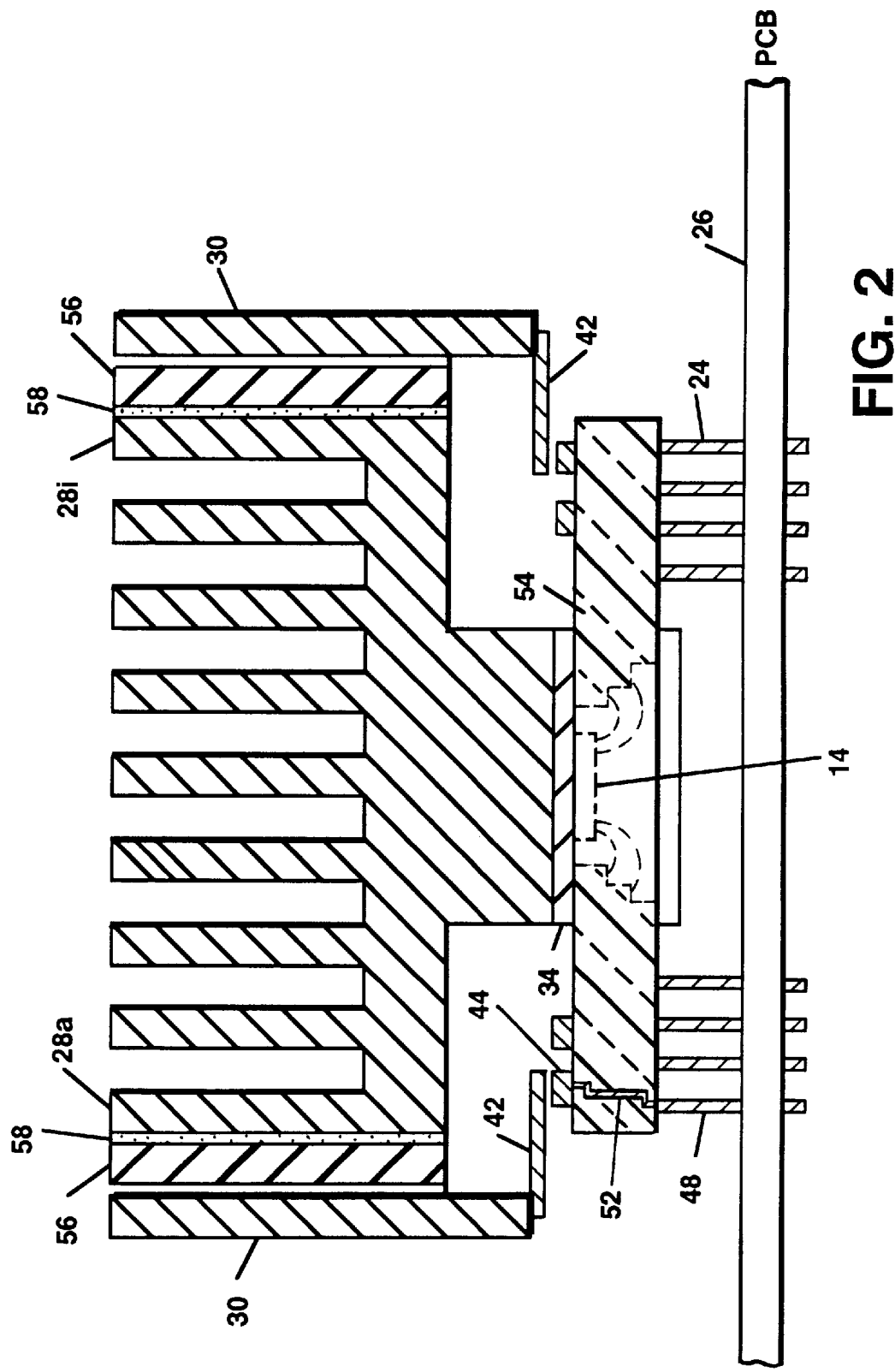
FIG. 2 is a cross sectional view of an IC package and heatsink with two planar conductive plates electrically connected to pads on the IC package and with the IC chip attached directly to the heatsink.

Referring now to FIG. 2, shield plates 30 are shown attached via leads 42 to the electrical pads 44 instead of to the PCB 26. The pads 44 are similar to the capacitor attachment pads 22 shown in FIG. 1. In the general case these pads may be attached to any reference potential, such as power or ground reference planes from PCB 26 through pins 24, or from a power source from IC 14. Typically, capacitor pads have one pad connected to a ground source, and one pad connected to a power source. Thus the standard capacitor pads already built into most packages would be appropriate for many embodiments of this invention, and the cost of specially designed packages may be avoided. In the preferred embodiment the shield plate 30 would be attached to a package pad 44 which has a direct low resistance path 52 through the package 54 to a dedicated lead 48, which has no connection to the other package leads 24, or to the IC 14.

Note that shields 30 are electrically isolated from heat sink 28 by electrically insulating layer 56. Layer 56 may be made of any electrically insulating material, and may be held in place between the shields 30 and the heat sink 28 by mechanical means or by attachment to either shield 30 or heat sink fins 28a and 28i, or both. Here the electrically insulating layer 56 is shown attached to the heatsink 28 by an adhesive layer 58. The choice of the dielectric constant of insulating layer 56 will have an effect on the efficiency of shields 40.

Further, the IC 14 is here directly attached to heat sink 28 by conductive adhesive or solder layer 34 through a hole in package 54. Thus there exists an increased emission of unwanted radiation from heat sink 28 because of the increased amplitude of the voltage signal connected to the heat sink. The shields 30 need to be electrically isolated from contact with the heat sink 28 because any voltage inadvertently driven onto heat sink 28 may directly affect the operation of IC 14. Such unwanted voltages may cause a reverse biased junction on IC 14, resulting in lost signals and possible creation of parasitic effects, such as what is known as a 'latch' or a 'SCR' condition. Such parasitic conditions are undesirable. Therefore the space between the shields 30 and the heatsink 28, which is preferably as small as possible for reasons explained previously, must either contain an insulating layer 56, typically less than 0.05 inches thick, such as that previously described, or must be maintained as an air gap sufficiently wide to prevent electrical arcing.

Referring now to FIG. 3, the shields 30 are shown spaced from a unidirectional heat sink 28 on PCB 26 by electrical insulators 56 attached by adhesive layer 58 to fins 28a and 28i. The direction of the general system air flow is shown to be parallel to the fins 28a–i on unidirectional heat sink 28. This is desirable to maximize the thermal efficiency of the heat sink.

The planar conductive plates suppress unwanted radio frequency radiation typically emitted by the heatsinks of packaged integrated circuits. Radiated electromagnetic energy from the heatsinks is reduced by using a set of planar conductive plates separated from and parallel to the fins of the unidirectional heatsink. The set of planar conductive plates are electrically isolated from the heatsink either by an air gap or by a layer of insulation, and each plate has at least one electrical contact connected to a reference plane, preferably the same reference plane used by the IC chip itself. Typically the conductive plates are separated from the heatsink by an air gap of approximately 0.10 inches, or by an insulator layer of approximately 0.05 inches. Other distances are of course possible. The more electrical contacts each plate has, the lower the electrical resistance will be, and the more efficient the radiation dampening effect.

It is envisioned that a single plate, properly attached to the reference plane, will produce 6 dB attenuation of the radiated field. This would represent a 75% reduction in radiated power. The use of two plates (i.e., one on two opposing sides), the normal configuration, may provide up to a 25 dB attenuation, depending on the frequency. This would be greater than a 99% reduction in radiated power. The height of the plates as compared to the height of the heat sink will also have an affect on the percentage reduction in radiated power level. Preferably, the plate height and width should be approximately the same as that of the heat sink. Omnidirectional heatsinks will be protected by the use of four conductive mesh plates arranged around the heatsink in a loose box like as seen in FIG. 4 configuration as shown in FIG. 4.

The reference plane used will typically be ground, but in certain cases, such as ICs using substrate bias generators, the conductive plates may be connected to an appropriate voltage source. The power supply may even be a variable voltage supply or signal to counteract the radiation output via destructive wavelength interference. The connection to the reference plane enables charge in the conductive plates to either drain away or to build up what is known in the art as a mirror charge (i.e., a charge passively created on the face of a conductive plate by the presence nearby of another charge), or to actively produce a countercharge which will create its own radiation field to cancel the radio frequency radiation emitted by the integrated circuit. The connection to the reference plane can be either direct to the printed circuit board or by conductive leads or through pads on the IC package itself directly attached to the conductive plates (Note the IC package connections should preferably be made by dedicated pins not shared with any other function).

The conductive plate or plates maybe made of either metal plates, printed circuit boards with one or more layers of ground, power or other conductive planes, or even a conductive mesh. The use of conductive mesh will allow air flow through the conductive plates. As long as the holes in the mesh are small enough to preclude radio frequency transmission the conductive mesh will provide an effective shield. The maximum size of the holes in the mesh is related to the smallest wavelength of the emitted radiation which is desired to be suppressed.

The same arrangement of plates described above to minimize EMI radiation could also serve as a shield against external electromagnetic interference for the integrated circuit.

It should be noted that although the preferred embodiments have been discussed using a unidirectional heat sink, the present invention is not so limited. The heatsink need not be a unidirectional in the general case, and omnidirectional heatsinks may be radiation shielded through the use of the above described conductive mesh plate or plates arranged around the heatsink. Most high performance, high operating frequency ICs typically use unidirectional heatsinks for maximum heat transfer efficiency, but there are cases where it is impossible to use the directed air flow required for efficient unidirectional heatsink usage. It will be apparent to one skilled in the art that the same arrangement of one or two plates may be used in the case of omnidirectional heat sinks, although a single box like plates or the use of four plates forming a box like structure would be more efficient for the omnidirectional heat sink case. Further, by the use of a porous material for plates, the reduction of over all air flow through the omnidirectional heat sink may be minimized. Such a porous material may be simply achieved as described above by the use of electrically conductive wire mesh for the shields. Care must be taken that the size of the holes in the shields must not be larger than the wavelength of the radiation that it is desired to suppress.

It should also be noted that the conductivity of the shields should be as high as possible. Thus care should be taken to provide the shields with as many low resistance contacts as possible to the ground supply, or to whatever voltage source, either static or dynamic, is desired.

In summary, the prior art heatsinks work well to remove unwanted heat from ICs, but are a source of unwanted EMI radiation because of their antenna like properties. Prior art heatsinks are also a cause of external EMI interference with the internal operation of the IC, again because of their antenna like properties. Thus, through the use of the shields it is possible to both increase the IC resistance to external EMI interference and decrease the unwanted emission of EMI radiation, while maintaining heatsink efficiency in removing unwanted heat.

Having described preferred embodiments of the invention, it will be apparent to one of skill in the art that other embodiments incorporating their concept may be used. It is felt, therefore, that this invention should not be limited to the disclosed embodiment, but rather should be limited only by the spirit and scope of the appended claims.

What is claimed is:

1. An apparatus for reducing EMI interference associated with an electronic device, comprises:
   at least one electrically conductive structure comprising:
      a heat sink in thermal communication with said electronic device, said heat sink having a bottom surface proximate to said electronic device, a top surface disposed opposite said bottom surface, and at least one side surface disposed between said top and bottom surfaces;
      at least one separate electrically conductive plate, having at least one electrical contact for electrically coupling to a reference plane, with said at least one electrically conductive plate physically and electrically insulated from direct contact with said heat sink, and solely disposed proximate to at least one of said at least one side surface.

2. The apparatus of claim 1 wherein said electronic device further comprising an integrated circuit and wherein said electrically conductive structure is disposed adjacent to, but not in direct electrical contact with said integrated circuit.

3. The apparatus of claim 2 wherein said electronic device further comprising a printed circuit board and wherein said integrated circuit and said electrically conductive plate are electrically and physically connected to the printed circuit board.

4. The apparatus of claim 3 wherein said integrated circuit and said electrically conductive plate are electrically connected to a voltage reference plane disposed upon said printed circuit board.

5. The apparatus of claim 1 wherein said electrically conductive structure has said heat sink physically isolated and electrically insulated from said at least one electrically conductive plate by a corresponding one of at least one air gap therebetween.

6. The apparatus of claim 1 wherein said electrically conductive structure has said heat sink electrically isolated from said at least one electrically conductive plate by a corresponding one of at least one layer of electrically insulating material disposed therebetween.

7. The apparatus of claim 6 wherein said electrically insulating material is physically attached to at least one of said electrically conductive plate and said electrically isolated heat sink.

8. The apparatus of claim 1 wherein said electrically conductive structure is disposed to protect said electronic circuit from radiation.

9. The apparatus of claim 1 wherein further said at least one electrically conductive plate comprises two self supporting plates on opposite sides of said electronic device.

10. The apparatus of claim 1 wherein further said at least one electrically conductive plate comprises four plates disposed to form a loose quadrilateral like structure surrounding said heat sink.

11. The apparatus of claim 1 wherein further said at least one electrically conductive plate is comprised of a printed circuit board having at least one conductive layer electrically connected to said reference plane.

12. The apparatus of claim 1 wherein further said at least one electrically conductive plate comprises a conductive mesh with apertures in said conductive mesh of a selected maximum size electrically connected to said reference plane.

13. The apparatus of claim 1 wherein further said reference plane is a variable voltage source producing an opposing field partially canceling EMI from said electronic device.

14. The apparatus of claim 1 wherein said at least one electrically conductive plate is approximately the same height and width as said heat sink.

15. An apparatus to suppress radio frequency radiation from packaged integrated circuits, comprises;

a packaged integrated circuit disposed within an electronic circuit package, said package having a unidirectional heat sink attached thereto, two planar conductive plates electrically isolated from while disposed in close proximity with said unidirectional heat sink, said conductive plates being aligned parallel to a predetermined direction of preferred air flow, with each one of said planar conductive plates having at least one electrical contact for connection to a voltage reference potential.

* * * * *